(12) United States Patent
Fulton et al.

(10) Patent No.: US 6,657,507 B2
(45) Date of Patent: Dec. 2, 2003

(54) ACTIVE ON-DIE INTEGRATED RESISTANCE CIRCUIT FOR REAL TIME CLOCK (RTC) OSCILLATORS

(75) Inventors: Robert R. Fulton, Folsom, CA (US); Chinnugounder Senthilkumar, Folsom, CA (US); Tea Lee, Rancho Cordova, CA (US)

(73) Assignee: Intel Corporation, Santa Clara, CA (US)

( * ) Notice: Subject to any disclaimer, the term of this patent is extended or adjusted under 35 U.S.C. 154(b) by 66 days.

(21) Appl. No.: 10/038,000

(22) Filed: Jan. 2, 2002

(65) Prior Publication Data

US 2003/0122629 A1 Jul. 3, 2003

(51) Int. Cl.$^7$ ................................................. H03B 5/32
(52) U.S. Cl. .................... 331/158; 331/116 R; 331/175; 331/182; 331/183
(58) Field of Search ................................ 331/182, 183, 331/175, 158, 116 R; 704/225

(56) References Cited

U.S. PATENT DOCUMENTS 4,704,587 A * 11/1987 Ouyang ................. 331/116 FE
6,191,662 B1    2/2001 Volk
6,405,164 B1 *  6/2002 Pinai ........................ 704/225

FOREIGN PATENT DOCUMENTS

JP           196857       * 7/2001

OTHER PUBLICATIONS

Millman "Microelectronics" McGraw Hill 1979 pp 237.*
Todd "FETs as voltage–variable resistors" Application Notes vol 13, No 19, Sep. 13, 1965 pp 66–69.*
Gibilisco "Handbook of Radio & Wireless Technology" McGraw Hill 1999 pp 90–93.*

* cited by examiner

*Primary Examiner*—Michael B Shingleton
(74) *Attorney, Agent, or Firm*—Blakely, Sokoloff, Taylor & Zafman LLP

(57) ABSTRACT

An oscillator circuit including an integrated circuit amplifier, an integrated circuit active resistance circuit to set the gain of the amplifier, a crystal resonator to set the frequency of the signal generated by the oscillator circuit, and a pair of capacitors respectively situated at the inputs and outputs of the amplifier to assist in the starting of the oscillation signal. The active resistance circuit is responsive to an input signal in order to set the gain of the amplifier slightly above unity gain in order to meet the criterion for oscillation, but not too much above unity gain where the oscillator would unduly consume too much power. Thus, the oscillator has inherent low power characteristics. The active resistance circuit allows the amplifier gain to be set by software or other electronic means.

28 Claims, 4 Drawing Sheets

ACTIVE ON-DIE INTEGRATED RESISTANCE CIRCUIT FOR REAL TIME CLOCK (RTC) OSCILLATORS

FIELD

This invention relates generally to electronic oscillators, and in particular, to an oscillator having an active feedback resistance circuit to set the desired operating condition of the oscillator's amplifier.

BACKGROUND

Current microprocessor systems use a crystal oscillator as part of a Real Time Clock (RTC) to keep track of the date and time of day. They typically use a relatively accurate and high frequency crystal oscillator, for example 32.768 kHz, which is divided to generate seconds, minutes and hours for the system. Because the Real Time Clock (RTC) needs to be running even when the microprocessor system is off, it is directly connected to a battery. The dependency on battery power raises power consumption issues among other accuracy, stability and manufacturing issues, as will be discussed with regard to the following example.

FIG. 1 illustrates a block diagram of a prior art processor system 100. The processor system 100 consists of a microprocessor 108 coupled to a memory controller 106, which is sometimes referred to in the relevant art as the "north-bridge." The memory controller 106 interfaces with the system memory 110. The processor system 100 further consists of an input/output (I/O) bus 102 coupled to an I/O controller 104, which is sometimes referred to as the "south-bridge." The "south bridge" is, in turn, coupled to the "north bridge." Typically included in the "south-bridge" circuit board is the Real Time Clock (RTC) for the processor system 100, which keeps track of the time and date for the system.

For discussion purposes, FIG. 1 only shows the crystal oscillator 120 portion of the Real Time Clock (RTC) for the processor system 100. The crystal oscillator 120 consists of an amplifier 122 including a crystal resonator 124, an external resistor 126, and a pair of capacitors CL11 and CL22. The crystal resonator 124 and external resistor 126 are connected between the input and output of the amplifier 122, i.e. in feedback with the amplifier. The capacitor CL11 is coupled between the input of the amplifier 122 and ground potential. Similarly, the capacitor CL12 is coupled between the output of the amplifier 122 and ground potential. The crystal resonator 124 resonates precisely at a particular frequency, which causes the oscillator 120 to generate a periodic signal cycling at such frequency. The external resistor 126 biases the amplifier 122 which affects its gain. The capacitors CL11 and CL12 serve to optimize the startup and loading conditions of the oscillator 120.

There are several drawbacks with regard to the external resistor 126 of the prior art oscillator 120. One set of drawbacks arises from the fact that the external resistor 126 sets the gain of the oscillator 120. In order to satisfy the condition for oscillation, the gain of the amplifier 122 should be at least one (1). However, a gain significantly over one (1) could lead to additional noise in the output signal of the oscillator 120, could also lead to instability of the oscillator 120, and could unduly increase the power consumption of the oscillator 120. Thus, the external resistor 126 should be precisely selected such that the gain of the amplifier 122 is slightly above unity gain. Because there are process variations with regard to the integrated circuit in which the amplifier 122 is formed, there can be substantial trial and error in selecting an external resistor 126 that sets the gain of the amplifier 122 slightly above unity. Such trial and error increases the costs, time and complexity of manufacturing the oscillator 120 in addition to reducing the reliability of the oscillator 120. In addition, once the external resistor 126 is selected, it becomes impractical to change the resistor later on to account for changes in the oscillator's performance due to aging or other changes in the environment and/or application.

Another set of drawbacks stems from the fact that the external resistor 126 lies external to the integrated circuit in which the amplifier 122 is formed. Since the external resistor 126 lies external to the amplifier integrated circuit, it is typically mounted on the "south bridge" circuit board along with the integrated circuit. This increases the board routing complexity as well as the manufacturing of the "south bridge" board, which leads to increased manufacturing time and costs. Also, because the external resistor 126 is situated external to the shielded integrated circuit, it is exposed to environment noise, thereby introducing additional noise into the oscillator signal.

DETAILED DESCRIPTION

Figure 1:
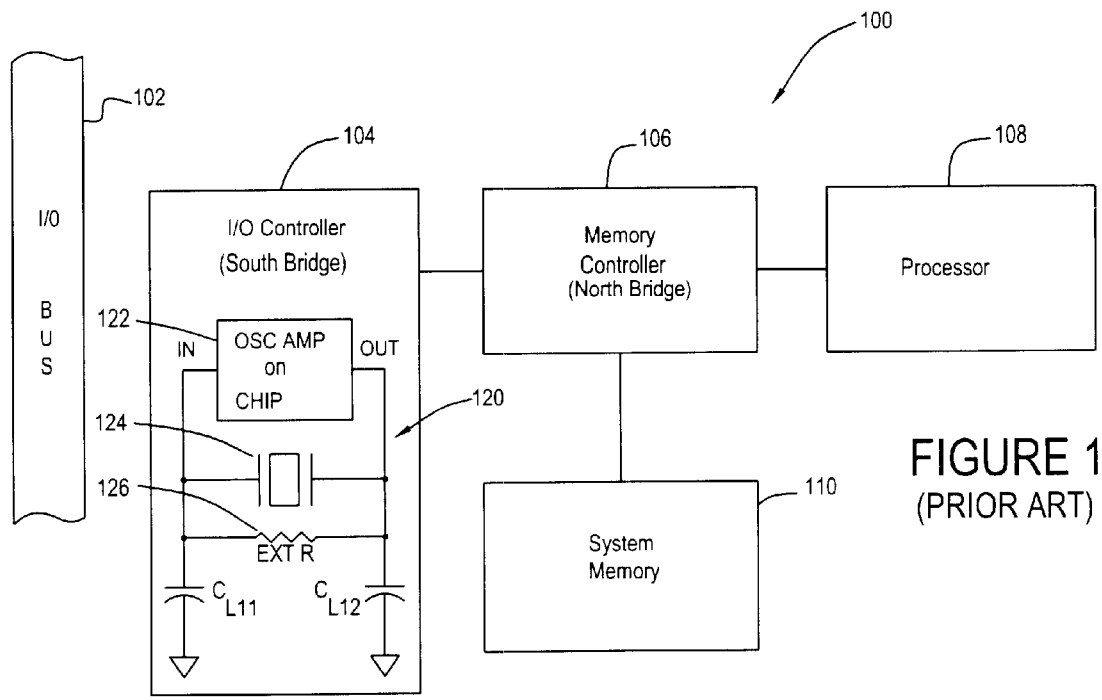
FIG. 1 illustrates a block diagram of a prior art processor system including an input/output controller with a clock circuit.
Figure 2:
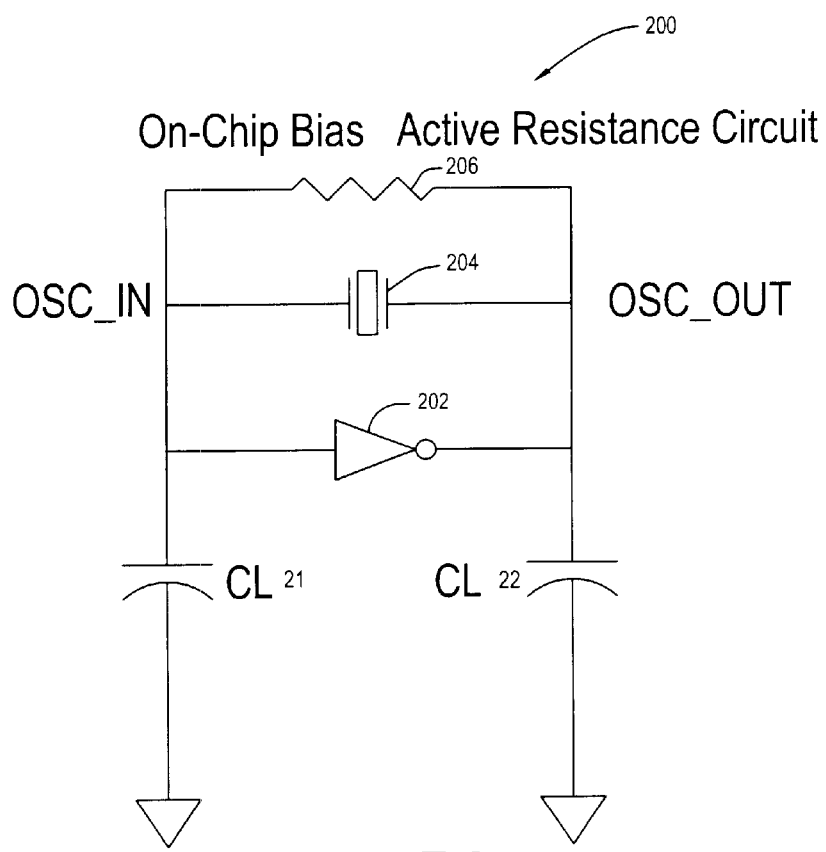
FIG. 2 illustrates a schematic diagram of an exemplary oscillator in accordance with an embodiment of the invention.

FIG. 2 illustrates a schematic diagram of an exemplary oscillator 200 in accordance with an embodiment of the invention. The oscillator 200 comprises an amplifier 202, a crystal resonator 204, input and output capacitors CL21 and CL22, and an on-chip bias active resistance circuit 206. The crystal resonator 204 and the on-chip active resistance circuit 206 are coupled in parallel between the input and output of the amplifier 202. The input and output capacitors CL21 and CL22 are coupled respectively between the input and output of the amplifier 202 and ground potential. The crystal resonator 204 resonates precisely at a particular frequency, which causes the oscillator 200 to generate a periodic signal cycling at such frequency. The on-chip external resistance circuit 206 sets the gain of the oscillator 200. The capacitors CL21 and CL22 serve to optimize the startup and loading conditions of the oscillator 200.

The exemplary oscillator 200 has several significant advantageous over the prior art oscillator 100 due to the on-chip active resistance circuit 206. First, the on-chip active resistance circuit 206 can be tuned electronically including by software means. Thus, the on-chip active resistance circuit 206 can be easily tuned to set the gain of the amplifier 202 at slightly above unity in order to meet the condition for oscillation without unduly consuming too much power. Consequently, less trial and error are required, which translates to less costs, time and complexity in the manufacturing of the oscillator 200 in addition to higher reliability for the oscillator 200. Furthermore, the active resistance circuit can be tuned "in situ" by software or other electronic means to take into account changes in the oscillator's performance and/or changes in the environment and/or application. Additional benefits resulting from the active resistance circuit being incorporated into an integrated circuit include less complex circuit routing for the "south bridge" board and potentially less noise in the oscillator signal.

Figure 3:
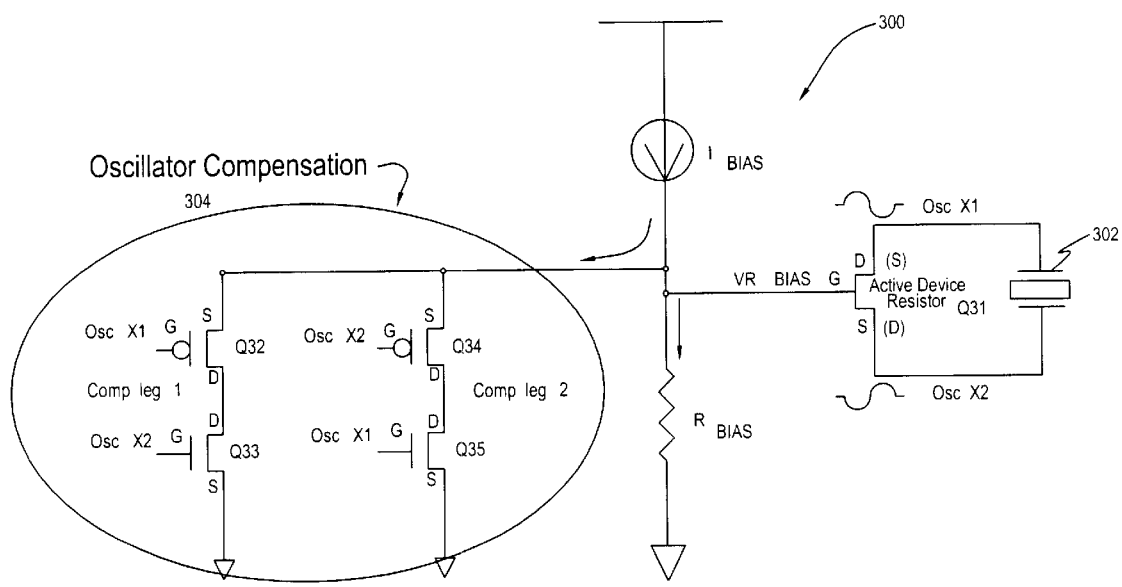
FIG. 3 illustrates a schematic diagram of an exemplary active resistance circuit in accordance with an embodiment of the invention.

FIG. 3 illustrates a schematic diagram of an exemplary active resistance circuit 300 in accordance with an embodiment of the invention. The active resistance circuit 300 is one exemplary embodiment of the active resistance circuit 206 of oscillator 200, and is coupled across the crystal resonator 302 of an oscillator. The active resistance circuit 300 comprises an active resistor field effect transistor (FET) Q31, a current source $I_{BIAS}$, a bias resistor $R_{BIAS}$, and an oscillator compensation circuit 304. The oscillator compensation circuit 304, in turn, comprises a first compensation leg including a p-channel FET Q32 and an n-channel FETs Q33, and a second compensation leg including a p-channel FET Q34 and an n-channel FET Q35. The current source $I_{BIAS}$ and bias resistor $R_{BIAS}$ are connected in series to generate a bias voltage $VR_{BIAS}$ to bias the gate of the active resistor FET Q31. The drain (D) and source (S) of the active resistor FET Q31 are respectively coupled on either side of the crystal resonator 302.

With regard to the oscillator compensation circuit 304, the sources (S) of p-channel FETs Q32 and Q34 are coupled to the gate of the active resistor FET Q31, the drains of the p-channel FETs Q32 and Q34 are respectively coupled to the drains (D) of the n-channel FETs Q33 and Q35, and the sources (S) of the n-channel FETs Q33 and Q35 are coupled to ground potential. The gates (G) of the p-channel FET Q32 and the n-channel FET Q35 are coupled to receive the "in-phase" oscillator signal Osc X1 on one side of the crystal resonator 302 (and active resistor FET Q31), and the gates (G) of the n-channel FET Q33 and the p-channel FET Q34 are coupled to receive the "out-of-phase" oscillator signal Osc X2 (approximately 180 degrees out-of-phase) on the other side of the crystal resonator 302 (and active resistor FET Q31).

The resistance across the channel of the active resistor FET Q31 is to maintain substantially constant in order to set the gain of the oscillator amplifier substantially constant and slightly above unity gain. In order to keep the channel resistance of the active resistor FET Q31 substantially constant, the gate-to-source voltage ($V_{GS}$) of the active resistor FET Q31 should also be substantially constant. However, the voltages on the drain (D) and source (S) of the active resistor FET Q31 fluctuate because they are respectively coupled to either side of the crystal resonator 302, and thereby respectively receive the "in-phase" and "out-of-phase" oscillator signals Osc X1 and Osc X2. Thus, the oscillator compensation circuit 304 is responsive to the "in-phase" and "out-of-phase" oscillator signals Osc X1 and Osc X2 in order to maintain the gate-to-source voltage ($V_{GS}$) of the active resistor FET Q31 substantially constant, as will be explained with reference to FIG. 4.

Figure 4:
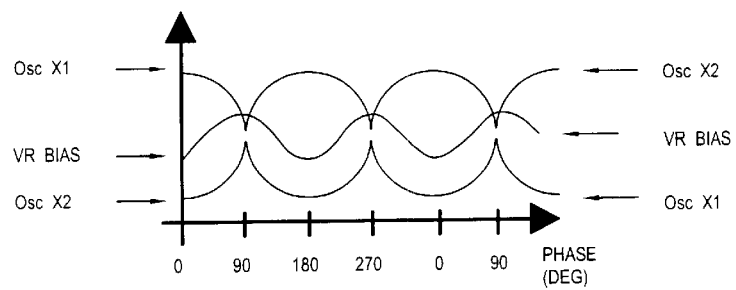
FIG. 4 illustrate a graph of exemplary waveforms present in the exemplary active resistance circuit in accordance with an embodiment of the invention.

FIG. 4 illustrate a graph of exemplary waveforms present in the exemplary active resistance circuit 300. The x-axis of the graph represents the phase of the oscillator signals. The y-axis of the graph represents the amplitude of the oscillator signals and bias voltage. The graph shows the "in-phase" oscillator signal Osc X1, the "out-of-phase" oscillator signal Osc X2, and the active resistor bias voltage $VR_{BIAS}$.

As the graph illustrates, when the phase of the "in-phase" oscillator signal X1 is at zero (0) degree and the phase of the "out-of-phase" oscillator signal Osc X2 is at 180 degrees, the amplitude of the "in-phase" oscillator signal Osc X1 is greater than the amplitude of the "out-of-phase" oscillator signal X2. Accordingly, at this phase the terminal of the active resistor FET Q31 exposed to the "in-phase" oscillator signal Osc X1 acts as the drain (D) and the other terminal exposed to the "out-of-phase" oscillator signal Osc X2 acts as the source (S). Since at this phase the voltage at the source (S) of the active resistor FET Q31 is at its minimum value, the bias voltage $VR_{BIAS}$ should also be at its minimum in order to keep the gate-to-source voltage ($V_{GS}$) of the active resistor FET Q31 substantially constant. The second compensation leg minimizes the bias voltage $VR_{BIAS}$ by drawing maximum current from the current source $I_{BIAS}$, thereby reducing the current through the bias resistor $R_{BIAS}$, and thereby lowering the bias voltage $VR_{BIAS}$. The second compensation leg draws the maximum current by having the minimized "out-of-phase" oscillator signal Osc X2 minimize the channel resistance of the FET Q34 and the maximized "in-phase" oscillator signal Osc X1 minimize the channel resistance of the FET Q35.

In the phase range from 0 degree to 90 degrees, the amplitude of the "in-phase" oscillator signal Osc X1 is decreasing and the amplitude of the "out-of-phase" oscillator signal Osc X2 is increasing. However, in this phase range the amplitude of the "in-phase" oscillator signal Osc X1 is greater than the amplitude of the "out-of-phase" oscillator signal Osc X2. Accordingly, the terminal of the active resistor FET Q31 exposed to the "in-phase" oscillator signal Osc X1 still acts as the drain (D) and the other terminal exposed to the "out-of-phase" oscillator signal Osc X2 still acts as the source (S). Since in this range the voltage at the source of the active resistor FET Q31 is increasing (because Osc X2 is increasing), the bias voltage $VR_{BIAS}$ should similarly increase to maintain the gate-to-source voltage ($V_{GS}$) of the active resistor FET Q31 substantially constant. The second compensation leg increases the bias voltage $VR_{BIAS}$ by gradually drawing less current from the current source $I_{BIAS}$, thereby increasing the current through the bias resistor $R_{BIAS}$, and thereby increasing the bias voltage $VR_{BIAS}$. The second compensation leg gradually draws less current by having the increasing "out-of-phase" oscillator signal Osc X2 increase the channel resistance of the FET Q34 and the decreasing "in-phase" oscillator signal Osc X1 increase the channel resistance of the FET Q35.

In the phase range from 90 to 180 degrees, the amplitude of the "in-phase" oscillator signal Osc X1 is still decreasing and the amplitude of the "out-of-phase" oscillator signal Osc X2 is still increasing. However, in this phase range the amplitude of the "in-phase" oscillator signal Osc X1 is less than the amplitude of the "out-of-phase" oscillator signal Osc X2. Accordingly, the terminal of the active resistor FET Q31 exposed to the "in-phase" oscillator signal Osc X1 now acts as the source (S) and the other terminal exposed to the "out-of-phase" oscillator signal Osc X2 now acts as the drain (D). Since in this range the voltage at the source of the active resistor FET Q31 is again decreasing (because Osc X1 is decreasing), the bias voltage $VR_{BIAS}$ should similarly decrease to maintain the gate-to-source voltage ($V_{GS}$) of the active resistor FET Q31 substantially constant. In this case, the first compensation leg decreases the bias voltage $VR_{BIAS}$ by gradually drawing more current from the current source $I_{BIAS}$, thereby decreasing the current through the bias resistor $R_{BIAS}$, and thereby decreasing the bias voltage $VR_{BIAS}$. The first compensation leg gradually draws more current by having the increasing "out-of-phase" oscillator signal Osc X2 decrease the channel resistance of the FET Q33 and the decreasing "in-phase" oscillator signal Osc X1 decrease the channel resistance of the FET Q32.

In the phase range from 180 to 270 degrees, the amplitude of the "in-phase" oscillator signal Osc X1 is now increasing and the amplitude of the "out-of-phase" oscillator signal Osc X2 is now decreasing. However, in this phase range the amplitude of the "in-phase" oscillator signal Osc X1 is still less than the amplitude of the "out-of-phase" oscillator signal Osc X2. Accordingly, the terminal of the active resistor FET Q31 exposed to the "in-phase" oscillator signal Osc X1 still acts as the source (S) and the other terminal exposed to the "out-of-phase" oscillator signal Osc X2 still acts as the drain (D). Since in this range the voltage at the source of the active resistor FET Q31 is now increasing (because Osc X1 is increasing), the bias voltage $VR_{BIAS}$ should similarly increase to maintain the gate-to-source voltage ($V_{GS}$) of the active resistor FET Q31 substantially constant. The first compensation leg increases the bias voltage $VR_{BIAS}$ by gradually drawing less current from the current source $I_{BIAS}$, thereby increasing the current through the bias resistor $R_{BIAS}$, and thereby increasing the bias voltage $VR_{BIAS}$. The first compensation leg gradually draws less current by having the decreasing "out-of-phase" oscillator signal Osc X2 increase the channel resistance of the FET Q33 and the increasing "in-phase" oscillator signal Osc X1 increase the channel resistance of the FET Q32.

Finally, in the phase range from 270 to 360 (0) degrees, the amplitude of the "in-phase" oscillator signal Osc X1 is still increasing and the amplitude of the "out-of-phase" oscillator signal Osc X2 is still decreasing. However, in this phase range the amplitude of the "in-phase" oscillator signal Osc X1 is now greater than the amplitude of the "out-of-phase" oscillator signal Osc X2. Accordingly, the terminal of the active resistor FET Q31 exposed to the "in-phase" oscillator signal Osc X1 now acts as the drain (D) and the other terminal exposed to the "out-of-phase" oscillator signal Osc X2 now acts as the source (S). Since in this range the voltage at the source of the active resistor FET Q31 is now decreasing (because Osc X2 is decreasing), the bias voltage $VR_{BIAS}$ should similarly decrease to maintain the gate-to-source voltage ($V_{GS}$) of the active resistor FET Q31 substantially constant. The second compensation leg decreases the bias voltage $VR_{BIAS}$ by gradually drawing more current from the current source $I_{BIAS}$, thereby decreasing the current through the bias resistor $R_{BIAS}$, and thereby decreasing the bias voltage $VR_{BIAS}$. The second compensation leg gradually draws more current by having the decreasing "out-of-phase" oscillator signal Osc X2 decrease the channel resistance of the FET Q34 and the increasing "in-phase" oscillator signal Osc X1 decrease the channel resistance of the FET Q35.

Figure 5:
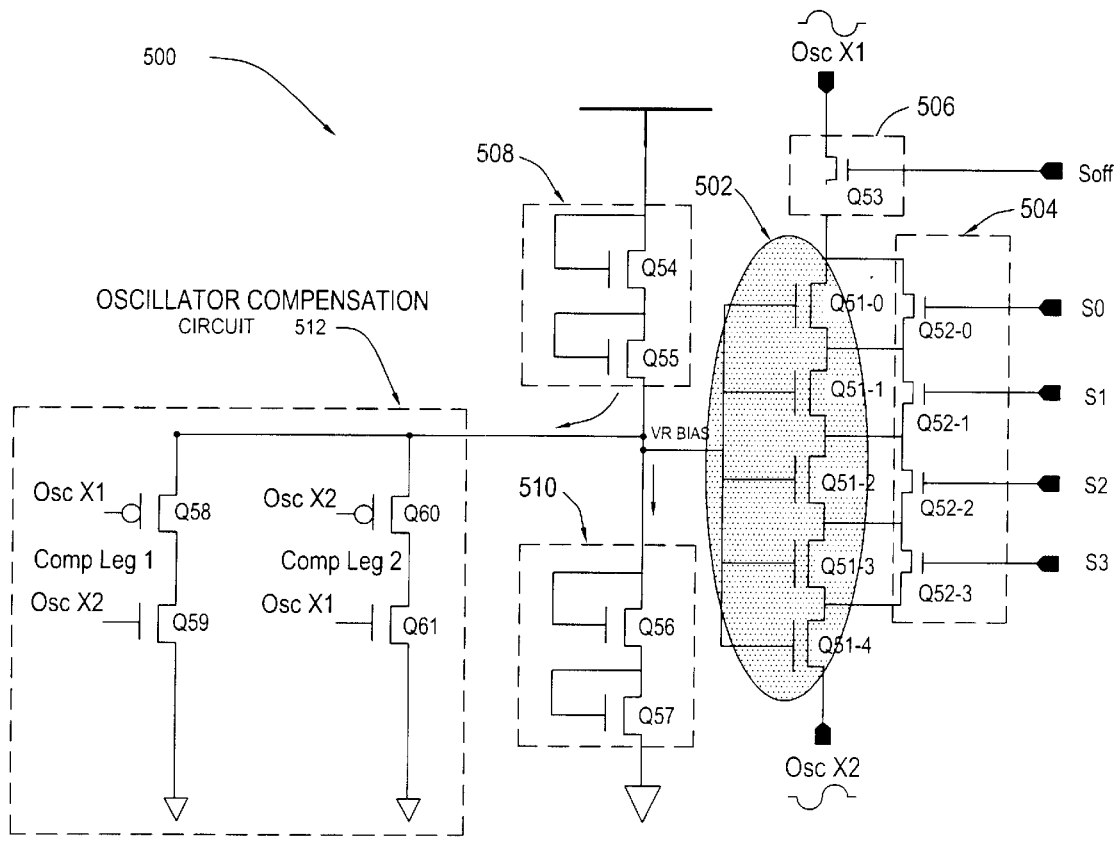
FIG. 5 illustrates a schematic diagram of an exemplary active resistance circuit in accordance with another embodiment of the invention.

FIG. 5 illustrates a schematic diagram of an exemplary active resistance circuit 500 in accordance with another embodiment of the invention. The exemplary active resistance circuit 500 is a more detailed embodiment of the active resistance circuit 300 previously discussed. The active resistance circuit 500 comprises an active resistance device 502, a resistance selection circuit 504, an active resistor enable device 506 (or an oscillator quality factor (Q) modifying or oscillator amplifier gain modifying device as will be discussed with reference to FIG. 6), a bias current source 508, a bias resistive device 510, and an oscillation compensation circuit 512.

The active resistance device 502, in turn, comprises a plurality of series-connected FETs Q51-0 through Q51-4 with gates connected in common. The resistance selection circuit 504, in turn, comprises a plurality of series-connected FETs Q52-0 through Q52-3 with gates to respectively receive resistance selection signals S0–3. The active resistor enable device 506 comprises a FET Q53 with a gate to receive an active resistor enable signal Soff. The current source 508, in turn, comprises a pair of diode-connected FETs Q54 and Q55 connected in series. The bias resistive device 510, in turn, comprises a pair of diode-connected FETs Q56 and Q57 connected in series. And, the oscillator compensation circuit 512 comprises a first compensation leg including series-connected p-channel FET Q58 and n-channel FET Q59, and a second compensation leg including series-connected p-channel FET Q60 and n-channel FET Q61.

The plurality of series-connected FETs Q51-0 through Q51-4 of the active resistance device 502 form the total resistance for setting the gain of the oscillator amplifier. The FETs Q51-0 through Q51-4 can be configured (e.g. by sizing the FETs) to provide different resistances. For example, the FETs Q51-0 through Q51-4 can be configured to provide increasing binary-weighted resistance (e.g. 1 K Ohms, 2 K Ohms, 4 K Ohms, 8 K Ohms, 16 K Ohms). The plurality of series-connected FETs Q52-0 through Q52-3 of the resistance selection circuit 504 are respectively coupled across the FETs Q51-0 through Q51-3 to bypass the selected FETs Q52-0 through Q52-3 using the resistance selection signals S0–S3. Using the resistance selection circuit 504, the net resistance of the active resistance device 502 can be set or changed by software or other electronic means.

The FET Q53 of the active resistor enable device 506 is connected in series with the active resistance device 502 to enable or disable the active resistance device 502. Using active resistor enable device 506, the active resistance device 502 can be disabled if an external resistor for the oscillator is used. The active resistor enable device 506 and the active resistance device 502 connected in series are coupled across the oscillator amplifier and crystal resonator. The current source 508 connected in series with the bias resistive device 510 which, in turn, is connected in parallel with the oscillator compensation circuit 512 generate the appropriate bias voltage $VR_{BIAS}$ which sets and maintains substantially constant the desired resistance of the active resistance device 502, as previously discussed with reference to active resistance circuit 300.

Figure 6:
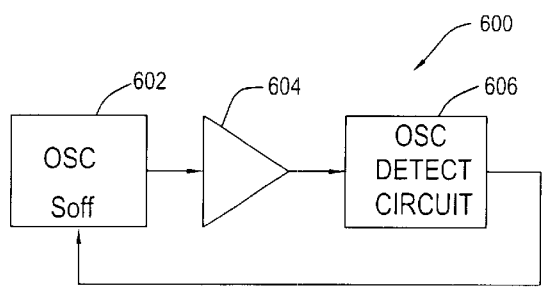
FIG. 6 illustrates a block diagram of an exemplary oscillator circuit in accordance with another embodiment of the invention.

FIG. 6 illustrates a block diagram of an exemplary oscillator circuit 600 in accordance with another embodiment of the invention. As previously alluded to, the active resistor enable device 506 can also be used as an oscillator quality factor (Q) modifying device or amplifier gain modifying device. Instead of the enable signal Soff fully turning on or off the FET Q53 to enable or disable the active resistance device 502, the signal Soff can be used to bias the FET Q53 to operate it as a variable resistor to change the quality factor (Q) and/or the gain of the oscillator 600. The oscillator 600 comprises an oscillator 602, a buffer 604, and an oscillating detect circuit 606. The oscillating detect circuit 606 detects whether the oscillator 602 is oscillating. If it is not because the resistance of the active resistance device is too low, the oscillating detect circuit 606 modifies to the signal Soff to increase the resistance of the FET Q53 until oscillation is detected. If oscillation is detected, the oscillator detect circuit 606 may cause the signal Soff to increase or decrease the resistance of the FET Q53 to achieve a desired quality factor (Q) and gain of the oscillator circuit 600.

Figure 7:
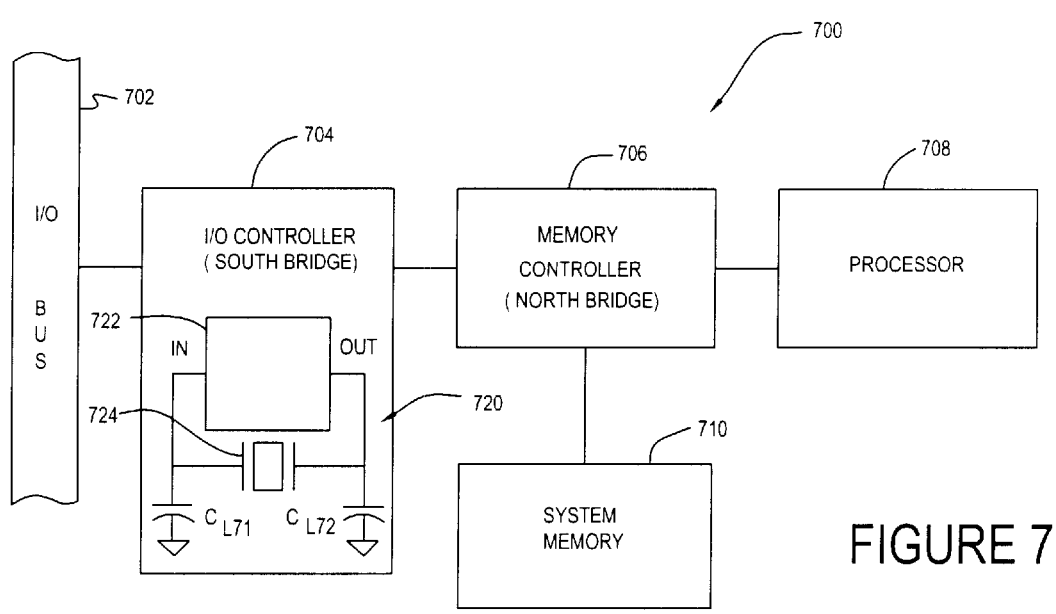
FIG. 7 illustrates a block diagram of an exemplary processor system in accordance with another embodiment of the invention.

FIG. 7 illustrates a block diagram of a prior art processor system 700. The processor system 700 comprises a microprocessor 708 coupled to a memory controller 706, which is sometimes referred to in the relevant art as the "north-bridge." The memory controller 706 interfaces with the system memory 710. The processor system 700 further comprises an input/output (I/O) bus 702 coupled to an I/O controller 704, which is sometimes referred to as the "south-bridge." The "south bridge" is, in turn, coupled to the "north bridge." Typically included in the "south-bridge" circuit board is the Real Time Clock (RTC) for the processor system 700, which keeps track of the time and date for the system. The Real Time Clock (RTC), in turn, comprises a crystal oscillator 720 including an integrated circuit 722 with an amplifier and an on-chip active resistance circuit in accordance with the invention, a crystal resonator 724, and a pair of capacitors CL71 and CL72. As previously discussed, the processor system 700 has several significant advantageous over the prior art processor system 100 due to the on-chip active resistance circuit.

Although the description of the exemplary embodiments described herein used the exemplary oscillator configuration shown in FIG. 2, it shall be understood that other types of oscillator configurations can benefit from the active resistance circuit described herein. In addition, although field effect transistors were used to describe the various embodiments of the invention, it shall be understood that other types of transistors, such as bipolar transistors, and other types of active devices can be used in place thereof.

In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative rather than a restrictive sense.

It is claimed:

1. An oscillator, comprising:
    an amplifier;
    a crystal resonator to cause said amplifier to generate an oscillating signal cycling at a particular frequency; and
    an active resistance circuit to set a gain of said amplifier, wherein said active resistance circuit comprises an active resistance device having an input for controlling resistance of said active resistance device, and a bias circuit to generate a control signal applied to said input of said active resistance device which varies responsively to said oscillating signal to maintain said resistance substantially constant.

2. The oscillator of claim 1, wherein said active resistance device comprises a transistor.

3. The oscillator of claim 2, wherein said transistor comprises a field effect transistor.

4. The oscillator of claim 2, wherein said transistor comprises a bipolar transistor.

5. The oscillator of claim 1, wherein said crystal resonator includes a first end coupled to an input of said amplifier and a second end coupled to an output of said amplifier.

6. The oscillator of claim 5, wherein said active resistance device comprises a field effect transistor with a drain coupled to said output of said amplifier and exposed to a first oscillator signal cycling with a first phase, and a source coupled to said input of said amplifier and exposed to a second oscillator signal cycling with a second phase, wherein said first phase is substantially opposite of said second phase.

7. An oscillator, comprising:
    an amplifier;
    a crystal resonator to cause said amplifier to oscillate at a particular frequency, wherein said crystal resonator includes a first end coupled to an input of said amplifier and a second end coupled to an output of said amplifier;
    an active resistance circuit to set a gain of said amplifier, wherein said active resistance circuit comprises a field effect transistor with a drain coupled to said output of said amplifier and exposed to a first oscillator signal cycling with a first phase, and a source coupled to said input of said amplifier and exposed to a second oscillator signal cycling with a second phase, wherein said first phase is substantially opposite of said second phase; and
    a bias circuit to maintain a gate-to-source ($V_{GS}$) of said field effect transistor substantially constant.

8. An oscillator, comprising:
    an amplifier;
    a crystal resonator to cause said amplifier to oscillate at a particular frequency, wherein said crystal resonator includes a first end coupled to an input of said amplifier and a second end coupled to an output of said amplifier;
    an active resistance circuit to set a gain of said amplifier, wherein said active resistance circuit comprises a field effect transistor with a drain coupled to said output of said amplifier and exposed to a first oscillator signal cycling with a first phase, and a source coupled to said input of said amplifier and exposed to a second oscillator signal cycling with a second phase, wherein said first phase is substantially opposite of said second phase;
    a bias circuit to maintain a gate-to-source ($V_{GS}$) of said field effect transistor substantially constant, wherein said bias circuit comprises:
        a current source;
        a bias resistive element coupled in series with said current source to generate a bias voltage; and
        an oscillator compensation circuit to vary said bias voltage in response to said first and second oscillator signals such that said gate-to-source voltage ($V_{GS}$) is maintained substantially constant.

9. The oscillator of claim 8, wherein said current source comprises at least one diode-connected transistor.

10. The oscillator of claim 8, wherein said bias resistive element comprises at least one diode-connected transistor.

11. The oscillator of claim 8, wherein said oscillator compensation circuit comprises a first compensation circuit to draw current from said current source in response to said first oscillator signal, and a second compensation circuit to draw current from said source in response to said second oscillator signal.

12. The oscillator of claim 11, wherein said oscillator compensation circuit comprises:
    a first pair of series-connected first and second transistors, said first transistor being responsive to said first oscillator signal and said second transistor being responsive to said second oscillator signal; and
    a second pair of series-connected third and fourth transistors, said third transistor being responsive to said first oscillator signal and said fourth transistor being responsive to said second oscillator signal.

13. The oscillator of claim 1, wherein said active resistance device comprises a plurality of series-connected transistors.

14. The oscillator of claim 13, wherein said plurality of series-connected transistors are respectively configured to provide different resistances.

15. The oscillator of claim 14, wherein said plurality of series-connected transistors are respectively configured to provide binary-weighted resistances.

16. The oscillator of claim 13, further comprising a resistance selection circuit to bypass at least one of said plurality of series-connected transistors in response to an input selection signal.

17. The oscillator of claim 16, wherein said resistance selection circuit comprises a plurality of bypassing transistors coupled in parallel with respective series-connected transistors.

18. The oscillator of claim 1, further comprising an active resistance enable circuit to enable or disable said active resistance circuit.

19. An oscillator, comprising:
an amplifier;
a crystal resonator to cause said amplifier to oscillate at a particular frequency;
an active resistance circuit to set a gain of said amplifier;
a quality factor modifying circuit to modify the quality factor of said oscillator; and
an oscillation detect circuit to detect whether said oscillator is generating an oscillator signal, and to control said quality factor modifying circuit in response to detecting whether said oscillator is generating an oscillating signal.

20. A method, comprising:
amplifying an input oscillating signal to form an output oscillating signal;
combining a first portion of said output oscillating signal filtered by a resonator with said input oscillating signal; and
combining a second portion of said output oscillating signal reduced in amplitude by an active resistance circuit with said input oscillating signal, wherein said active resistance circuit comprises an active resistance device having an input for controlling resistance of said active resistance device, and a bias circuit to generate a control signal applied to said input of said active resistance device which varies responsively to said oscillating signal to maintain said resistance substantially constant.

21. The method of claim 20, wherein said active resistance device comprises a transistor including a conduction channel with a first end exposed to said output oscillating signal and a second end exposed to said input oscillating signal.

22. A method, comprising:
amplifying an input oscillating signal to form an output oscillating signal;
combining a first portion of said output oscillating signal filtered by a resonator with said input oscillating signal;
combining a second portion of said output oscillating signal reduced in amplitude by an active resistance circuit with said input oscillating signal;
applying a control signal to said active resistance circuit to alter a gain associated with amplifying said input oscillating signal, wherein said active resistance circuit comprises a field effect transistor, and further comprising maintaining a gate-to-source ($V_{GS}$) of said field effect transistor substantially constant in response to said input and/or output oscillating signals.

23. A method, comprising:
amplifying an input oscillating signal to form an output oscillating signal;
combining a first portion of said output oscillating signal filtered by a resonator with said input oscillating signal;
combining a second portion of said output oscillating signal reduced in amplitude by an active resistance circuit with said input oscillating signal;
applying a control signal to said active resistance circuit to alter a gain associated with amplifying said input oscillating signal, wherein said active resistance circuit comprises a field effect transistor; and
maintaining a gate-to-source ($V_{GS}$) of said field effect transistor substantially constant in response to said input and/or output oscillating signals, wherein maintaining said gate-to-source (VGS) voltage substantially constant comprises:
generating a current;
directing said current through a resistive element to form a gate voltage for said field effect transistor; and
modifying said gate voltage in response to said input and/or output oscillating signals to maintain said gate-to-source (VGS) substantially constant.

24. A processor system, comprising:
a processor; and
a real time clock (RTC) circuit including an oscillator comprising:
an amplifier formed in an integrated circuit;
a crystal resonator to cause said amplifier to generate an oscillating signal cycling at a particular frequency; and
an active resistance circuit to set a gain of said amplifier, said active resistance circuit being formed in said integrated circuit, wherein said active resistance circuit comprises an active resistance device having an input for controlling resistance of said active resistance device, and a bias circuit to generate a control signal applied to said input of said active resistance device which varies responsively to said oscillating signal to maintain said resistance substantially constant.

25. The processor system of claim 24, wherein said crystal resonator includes a first end coupled to an input of said amplifier and a second end coupled to an output of said amplifier.

26. The processor system of claim 25, wherein said active resistance device comprises a field effect transistor with a drain coupled to said output of said amplifier and exposed to a first oscillator signal cycling with a first phase, and a source coupled to said input of said amplifier and exposed to a second oscillator signal cycling with a second phase, wherein said first phase is substantially opposite of said second phase.

27. A processor system, comprising:
a processor;
a real time clock (RTC) circuit including an oscillator comprising:
an amplifier formed in an integrated circuit;
a crystal resonator to cause said amplifier to oscillate at a particular frequency, wherein said crystal resonator includes a first end coupled to an input of said amplifier and a second end coupled to an output of said amplifier; and an active resistance circuit to set a gain of said amplifier, said active resistance circuit being formed in said integrated circuit, wherein said active resistance circuit comprises a field effect transistor with a drain coupled to said output of said amplifier and exposed to a first oscillator signal cycling with a first phase, and a source coupled to said input of said amplifier and exposed to a second oscillator signal cycling with a second phase, wherein said first phase is substantially opposite of said second phase; and a bias circuit to maintain a gate-to-source (VGS) of said field effect transistor substantially constant.

28. A processor system, comprising:

a processor;

a real time clock (RTC) circuit including an oscillator comprising:

an amplifier formed in an integrated circuit;

a crystal resonator to cause said amplifier to oscillate at a particular frequency, wherein said crystal resonator includes a first end coupled to an input of said amplifier and a second end coupled to an output of said amplifier; and an active resistance circuit to set a gain of said amplifier, said active resistance circuit being formed in said integrated circuit, wherein said active resistance circuit comprises a field effect transistor with a drain coupled to said output of said amplifier and exposed to a first oscillator signal cycling with a first phase, and a source coupled to said input of said amplifier and exposed to a second oscillator signal cycling with a second phase, wherein said first phase is substantially opposite of said second phase; and a bias circuit to maintain a gate-to-source (VGS) of said field effect transistor substantially constant, wherein said bias circuit comprises:

a current source;

a bias resistive element coupled in series with said current source to generate a bias voltage; and an oscillator compensation circuit to vary said bias voltage in response to said first and second oscillator signals such that said gate-to-source voltage ($V_{GS}$) is maintained substantially constant.

* * * * *